(12) United States Patent
Su et al.

(10) Patent No.: US 12,237,152 B2
(45) Date of Patent: Feb. 25, 2025

(54) TWO-DIMENSIONAL ELECTRONIC COMPONENT AND METHOD OF MANUFACTURING SAME

(71) Applicant: National Central University, Taoyuan (TW)

(72) Inventors: Ching-Yuan Su, Taoyuan (TW); En Yi Liao, Taoyuan (TW)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 394 days.

(21) Appl. No.: 17/730,073

(22) Filed: Apr. 26, 2022

(65) Prior Publication Data
US 2023/0105515 A1  Apr. 6, 2023

Related U.S. Application Data

(60) Provisional application No. 63/252,816, filed on Oct. 6, 2021.

(51) Int. Cl.
*H01L 29/24* (2006.01)
*H01J 37/32* (2006.01)
(Continued)

(52) U.S. Cl.
CPC .... *H01J 37/32449* (2013.01); *H01J 37/3476* (2013.01); *H01L 21/02568* (2013.01);
(Continued)

(58) Field of Classification Search
CPC .. H01J 37/32449; H01J 37/32; H01J 37/3476; H01J 37/34; H01J 2237/332; H01J 2237/334; H01L 21/02568; H01L 21/02439; H01L 21/02; H01L 21/02499; H01L 21/0259; H01L 21/02631; H01L 21/02664; H01L 21/02365; H01L 29/24; H01L 29/16; H01L 29/18; H01L 29/20; H01L 29/22; H01L 29/242; H01L 29/26; H01L 29/66969; H01L 29/66; H01L 29/7606; H01L 29/78696; H01L 29/78612; H01L 29/78621; H01L 29/786; H01L 29/0665; H01L 29/06; H01L 29/42392; H01L 29/423; H01L 29/0673; H01L 29/42356; H01L 29/42324; H01L 29/4234; H01L 29/778; H01L 29/861; H01L 29/0847; H01L 29/0653; H01L 29/1079; H01L 29/7833; H01L 29/78618; H01L 29/08; H01L 29/78681; H01L 21/304; H01L 29/803; H10K 99/00
See application file for complete search history.

(56) References Cited

U.S. PATENT DOCUMENTS

2023/0099814 A1\*  3/2023  Maxey ............. H01L 29/66969
257/29

\* cited by examiner

*Primary Examiner* — Nikolay K Yushin
(74) *Attorney, Agent, or Firm* — Cheng-Ju Chiang

(57) ABSTRACT

A two-dimensional electronic component includes a substrate; an artificial two-dimensional (2D) material disposed on the substrate; and a first metallic electrode disposed on the artificial 2D material. The artificial 2D material includes a layered atomic structure including a middle atomic layer, a lower atomic layer disposed on a lower surface of the middle atomic layer, and an upper atomic layer disposed on an upper surface of the middle atomic layer respectively. The upper atomic layer and the first metallic electrode are attracted together at a junction therebetween by metallic bonding.

15 Claims, 14 Drawing Sheets

(51) Int. Cl.
*H01J 37/34* (2006.01)
*H01L 21/02* (2006.01)
*H01L 29/26* (2006.01)
*H01L 29/66* (2006.01)
*H01L 29/76* (2006.01)
*H01L 29/786* (2006.01)
H01L 29/06 (2006.01)
H01L 29/423 (2006.01)

(52) U.S. Cl.
CPC ............ *H01L 29/24* (2013.01); *H01L 29/242* (2013.01); *H01L 29/26* (2013.01); *H01L 29/66969* (2013.01); *H01L 29/7606* (2013.01); *H01L 29/78696* (2013.01); *H01J 2237/332* (2013.01); *H01J 2237/334* (2013.01); *H01L 29/0665* (2013.01); *H01L 29/42392* (2013.01)

TWO-DIMENSIONAL ELECTRONIC COMPONENT AND METHOD OF MANUFACTURING SAME

BACKGROUND OF THE INVENTION

1. Technical Field

The technical field relates to two-dimensional (2D) electronic components, and more particularly relates to a 2D electronic component formed of artificial material and a method of manufacturing same.

2. Description of Related Art

It is known that graphene having zero band gap used in electronic components has drawbacks particularly in logic circuits. 2D materials such as transition metal dichalcogenides (TMDs) including molybdenum disulfide ($MoS_2$), tungsten disulfide ($WS_2$), and tungsten diselenide ($WSe_2$) have excellent electrical properties and different energy gaps and thus have a great potential to become a next generation semiconductor material. In detail, TMDs have excellent thermal conduction, electronic, optical and mechanical properties similar to that of grapheme. Further, TMDs have an energy gap not possessed by graphene. It is widely believed that TMDs will become a candidate material for 3 nm process in semiconductor manufacturing.

Complementary metal-oxide-semiconductor is a type of metal-oxide-semiconductor field-effect transistor (MOSFET) fabrication process that uses complementary and symmetrical pairs of p-type and n-type MOSFETs for logic functions. Field-effect transistor (FET) is a type of transistor that uses an electric field to control the flow of current in a semiconductor. Fin field-effect transistor (FinFET) is a multigate device, a MOSFET built on a substrate where the gate is placed on two, three, or four sides of the channel or wrapped around the channel, forming a double or even multi gate structure. These devices have been given the generic name "FinFETs" because the source/drain region forms fins on the silicon surface. The FinFET devices have significantly faster switching times and higher current density than planar CMOS technology. For the purpose of miniaturization, the number of fins of FinFET is decreased from three to two. That is, a unit height of process nodes of each generation is decreased. However, the advancement sacrifices both driving current and variety. For improving both the decreased driving current and variety, heights of the fins are required to increase in the fabrication process of FinFETs.

It is understood that such 2D materials for manufacturing semiconductors should have acceptable energy gaps, high carrier mobility, high on-current current ratio, low energy consumption, high integration, and high reliability. Thus, there are many problems to be solved prior to mass production. These problems include controllability of large area synthesis, wafer level transfer, contact resistance, and reliability analysis of components. Particularly, the 2D materials are required to be compatible with current semiconductor manufacturing processes including extreme ultraviolet (EUV) radiation used in photolithography, patterns, metallic processes, and deposition and annealing of high-K materials. Factors including EUV photons used in photolithography capable of penetrating photoresist to damage the 2D material, and impact and reliability of electronic components made of conventional 2D material should be taken into consideration in the development of new 2D materials.

Thus, it is desirable to provide a 2D electronic component and a method of manufacturing same both having improved characteristics.

SUMMARY OF THE INVENTION

The disclosure is directed to a 2D electronic component having excellent physical and chemical properties for manufacturing semiconductors in order to eliminate drawbacks including those associated with the conventional art. The disclosure is further directed to a method of manufacturing the 2D electronic component.

It is therefore one object of the invention to provide a two-dimensional electronic component, comprising a substrate; an artificial two-dimensional (2D) material disposed on the substrate; and a first metallic electrode disposed on the artificial 2D material; wherein the artificial 2D material includes a layered atomic structure including a middle atomic layer, a lower atomic layer disposed on a lower surface of the middle atomic layer, and an upper atomic layer disposed on an upper surface of the middle atomic layer respectively; and wherein the upper atomic layer and the first metallic electrode are attracted together at a junction therebetween by metallic bonding.

In one of the exemplary embodiments, the upper atomic layer includes a first heterogeneous zone which is a first metal atomic layer; and wherein the first metal atomic layer and the first metallic electrode are attracted together at a junction therebetween by metallic bonding.

In one of the exemplary embodiments, the first metal atomic layer is formed of metal atoms which are atoms of nickel (Ni), tungsten (W), copper (Cu), titanium (Ti), palladium (Pd), bismuth (Bi), antimony (Sb) or platinum (Pt).

In one of the exemplary embodiments, the middle atomic layer is a 2D planar atomic structure formed of a transition metal.

In one of the exemplary embodiments, the transition metal selected from the group consisting of tungsten (W), molybdenum (Mo), titanium (Ti), platinum (Pt), platinum (Pt), indium (In), tin (Sn), niobium (Nb) and Tantalum (Ta).

In one of the exemplary embodiments, the lower atomic layer is formed of sulfur (S), selenium (Se), or tellurium (Te).

In one of the exemplary embodiments, the upper atomic layer further comprises a second heterogeneous zone formed of oxide and other chemical compounds.

In one of the exemplary embodiments, the oxide and other chemical compounds is oxide.

In one of the exemplary embodiments, the oxide and other chemical compounds is nitride.

In one of the exemplary embodiments, further comprises a second heterogeneous zone which is a second metal atomic layer; a second metallic electrode disposed on the second metal atomic layer wherein the second metal atomic layer and the second metallic electrode are attracted together at a junction therebetween by metallic bonding; a gate insulating layer disposed on the upper atomic layer; and a gate disposed on the gate insulating layer to form an upper gate transistor; wherein the artificial 2D material is a semiconductor channel material.

It is another object of the invention to provide a method of manufacturing the two-dimensional electronic component, comprising the steps of providing a substrate; placing an artificial 2D material having a layered atomic structure on the substrate in a vacuumed environment; defining a first heterostructure on an atomic layer of the artificial 2D material to make a semiconductor pattern; using plasma to remove the atomic layer of the artificial 2D material to expose unsaturated compounds; and introducing heterogeneous atoms into the vacuumed environment wherein the heterogeneous atoms are different from atoms of the atomic layer of the artificial 2D material; and binding the heterogeneous atoms with the unsaturated compounds to form a first heterogeneous zone.

In one of the exemplary embodiments, the heterogeneous atoms are atoms of an atomic structure formed of metal, and wherein the metal is selected from the group consisting of nickel (Ni), tungsten (W), copper (Cu), titanium (Ti), palladium (Pd), bismuth (Bi), antimony (Sb) or platinum (Pt).

In one of the exemplary embodiments, further comprises the step of forming a metallic electrode on the first heterogeneous zone by performing a semiconductor process.

The above and other objects, features and advantages of the invention will become apparent from the following detailed description taken with the accompanying drawings.

DETAILED DESCRIPTION OF THE INVENTION

Figure 1:
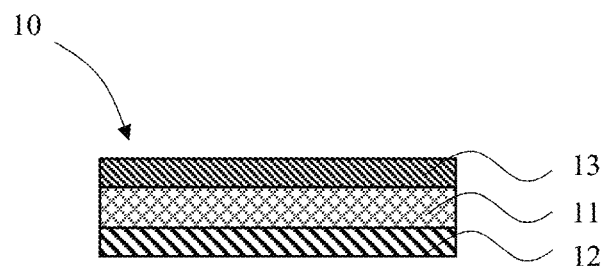
FIG. 1 is a longitudinal sectional view of an artificial 2D material according to a first preferred embodiment of the invention.

Embodiments of the invention will now be described, by way of example only, with reference to the accompanying drawings.

In the invention, each layer of a layered atomic structure is a 2D planar atomic layer and is schematically shown in the drawings. Each layer has a thickness but the invention is not limited to such. The atomic layer of the 2D plane means a monolayer. In the invention, upper, lower, first, second and third are used to show relative locations of different elements and are for ease of illustration. The invention does not aim to limit the elements to such locations.

In a first preferred embodiment of the invention, an artificial 2D material having two heterogeneous junctions is described. Synthesis platform is used to break two homogeneous surfaces (i.e., MXX in which M is transition metal and X means sulfide) of a TMD and form two heterogeneous surfaces (i.e., MXY in which M is transition metal, X means a first chalcogen element and Y means a second chalcogen element different from the first one) of the TMD. Physical and chemical properties of the artificial 2D material having two heterogeneous junctions are more advantageous than that of the artificial 2D material having two homogeneous junctions of the conventional art. These properties includes increased energy gap controllability in comparison with the conventional TMDs and increased conduction capability in comparison with the conventional 2D material having two homogeneous junctions.

Referring to FIG. 1, an artificial 2D material 1 in accordance with a first preferred embodiment of the invention comprises a layered atomic structure 10 including a middle atomic layer 11, a lower atomic layer 12 and an upper atomic layer 13 in which the lower atomic layer 12 and the upper atomic layer 13 are disposed on lower and upper surfaces of the middle atomic layer 11 respectively; the middle atomic layer 11 is a 2D planar atomic structure formed of a transition metal selected from the group consisting of titanium (Ti), vanadium (V), chromium (Cr), manganese (Mn), iron (Fe), cobalt (Co), nickel (Ni), copper (Cu), tin (Sn), zinc (Zn), zirconium (Zr), niobium (Nb), molybdenum (Mo), cadmium (Cd), hafnium (Hf), platinum (Pt), tantalum (Ta), tungsten (W), and rhenium (Re); and the lower atomic layer 12 and the upper atomic layer 13 are formed of sulfur, selenium, or tellurium. In the embodiment, the artificial 2D material 1 is a 2D crystalline material. The lower atomic layer 12 and the upper atomic layer 13 are a 2D planar atomic structure formed of heterogeneous atoms. Atoms of the layered atomic structure 10 are bound by chemical bonding.

A Schottky barrier is a potential energy barrier for electrons formed at a metal-semiconductor junction. Schottky barriers have rectifying characteristics, suitable for use as a diode. The Schottky barrier is fixed relative to the metal's Fermi level. A phenomenon referred to as "Fermi level pinning" caused some point of the band gap, at which finite DOS exists, to be locked (pinned) to the Fermi level. These factors affect electrical impedance. Electrical impedance is an issue to be addressed in electronic components formed of 2D material. It is desired to decrease electrical impedance between channels and electrodes of a semiconductor formed of 2D material to a value less than 100μΩ.

Figure 2:
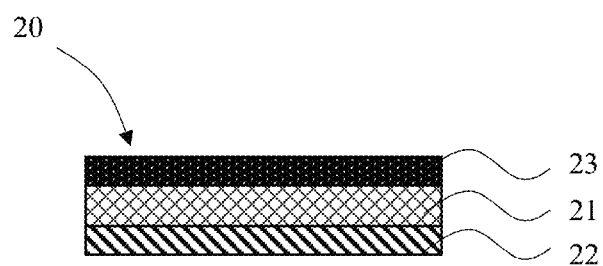
FIG. 2 is a longitudinal sectional view of an artificial 2D material according to a second preferred embodiment of the invention.

Referring to FIG. 2, an artificial 2D material 2 in accordance with a second preferred embodiment of the invention is shown. The characteristics of the second preferred embodiment are substantially the same as that of the first preferred embodiment except the following: the artificial 2D material 2 comprises a layered atomic structure 20 including a middle atomic layer 21, a lower atomic layer 22 and an upper atomic layer 23 in which the lower atomic layer 22 and the upper atomic layer 23 are disposed on lower and upper surfaces of the middle atomic layer 21 respectively; the middle atomic layer 21 is a 2D planar atomic structure formed of a transition metal selected from the group consisting of titanium (Ti), vanadium (V), chromium (Cr), manganese (Mn), iron (Fe), cobalt (Co), nickel (Ni), copper (Cu), tin (Sn), zinc (Zn), zirconium (Zr), niobium (Nb), molybdenum (Mo), cadmium (Cd), hafnium (Hf), platinum (Pt), tantalum (Ta), tungsten (W), and Rhenium (Re); and the lower atomic layer 22 and the upper atomic layer 23 are formed of sulfur, selenium, or tellurium. In the embodiment, the artificial 2D material 2 is a 2D crystalline material. The lower atomic layer 22 and the upper atomic layer 23 are a 2D planar atomic structure formed of heterogeneous atoms. Atoms of the middle atomic layer 21 and the upper atomic layer 23 are bound by metallic bonding. As a result, an artificial 2D alloy material having a first metal-transition metal-sulfur junction structure, i.e., two heterogeneous junctions are formed.

In the embodiment, the artificial 2D alloy material having two heterogeneous junctions is formed by synthesis. In detail, metals are introduced into the artificial 2D material to change its junctions of sulfide-transition metal-sulfide to junctions of transition metal(M)-sulfide(X)-metal(Z) (MXZ) by synthesis. As a result, an artificial 2D alloy material is formed. The artificial 2D alloy material has advantages including improved electrical characteristics, improved energy gap adjustment, and lower contact resistance in comparison with the conventional artificial 2D material having junctions of sulfide-transition metal-sulfide.

Figure 3:
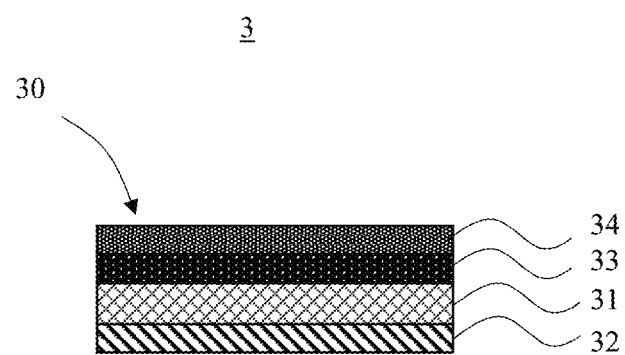
FIG. 3 is a longitudinal sectional view of an artificial 2D material according to a third preferred embodiment of the invention.

Referring to FIG. 3, an artificial 2D material 3 in accordance with a third preferred embodiment of the invention is shown. The third preferred embodiment aims to meet the demands of more 2D material applications and advanced semiconductor manufacturing processes including depositing metal layer. The characteristics of the third preferred embodiment are substantially the same as that of the second preferred embodiment except the following: the artificial 2D material 3 comprises a layered atomic structure 30 including a middle atomic layer 31, a lower atomic layer 32, an upper atomic layer 33 and an outer atomic layer 34 on the upper atomic layer 33 in which the lower atomic layer 32 and the upper atomic layer 33 are disposed on lower and upper surfaces of the middle atomic layer 31 respectively; the middle atomic layer 31 is a 2D planar atomic structure formed of a transition metal selected from the group consisting of titanium (Ti), vanadium (V), chromium (Cr), manganese (Mn), iron (Fe), cobalt (Co), nickel (Ni), copper (Cu), tin (Sn), zinc (Zn), zirconium (Zr), niobium (Nb), molybdenum (Mo), cadmium (Cd), hafnium (Hf), platinum (Pt), tantalum (Ta), tungsten (W), and Rhenium (Re); the lower atomic layer 32 is formed of sulfur, selenium, or tellurium; the upper atomic layer 33 is a first metal layer formed of a metal selected from the group consisting of nickel (Ni), tungsten (W), copper (Cu), bismuth (Bi), titanium (Ti) and platinum (Pt); and the outer atomic layer 34 is a second metal layer formed of a metal selected from the group consisting of cobalt (Co), nickel (Ni), tungsten (W), copper (Cu), bismuth (Bi), titanium (Ti), antimony (Sb), gold (Au) and platinum (Pt).

In the embodiment, the artificial 2D material 3 is a 2D crystalline material. The lower atomic layer 32 and the upper atomic layer 33 are a 2D planar atomic structure formed of heterogeneous atoms. Atoms of the middle atomic layer 31 and the upper atomic layer 33 are bound by metallic bonding. As a result, an artificial 2D alloy material having a second metal(or first metal)-transition metal-sulfur junction structure, i.e., two different junctions is formed.

Figure 4:
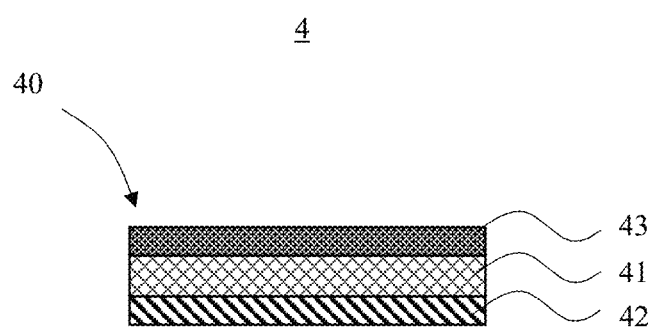
FIG. 4 is a longitudinal sectional view of an artificial 2D material according to a fourth preferred embodiment of the invention.

Referring to FIG. 4, an artificial 2D material 4 in accordance with a fourth preferred embodiment of the invention is shown. The characteristics of the fourth preferred embodiment are substantially the same as that of the first preferred embodiment except the following: the artificial 2D material 4 comprises a layered atomic structure 40 including a middle atomic layer 41, a lower atomic layer 42, and an upper atomic layer 43 in which the upper atomic layer 43 is formed of oxygen (O), phosphor (P), nitrogen (N), chlorine (Cl), carbon (C), or fluorine (F). In the embodiment, the artificial 2D material is al 2D compound material. Taking oxygen atoms as an example, an artificial 2D compound material having an oxygen-transition metal-sulfur junction structure, i.e., two heterogeneous junctions are formed.

As described above, an artificial 2D material having two a plurality of heterogeneous junctions is formed. It is understood that a method of manufacturing the artificial 2D material having two heterogeneous or homogenous junctions can be implemented depending on applications. In the above embodiments, the artificial 2D material has three or four atomic layers. It is understood that the artificial 2D material of the invention is not limited to have three or four layers. The method of the invention can manufacture an artificial 2D material having more atomic layers depending on applications.

Conventionally, semiconductor material field employs various synthesis technologies to change size and phase, eliminate deficiencies, introduce impurities ("doping") into the crystal structure, and use high entropy alloys so that semiconductor material can have more advantageous features and ubiquitous properties which are useful in energy, optoelectronics, etc. However, conventional technologies cannot precisely control synthesis in atoms. Regarding synthesis of semiconductor material, it is understood that removal of atomic layers of a 2D material may generate unsaturated compounds which will be oxidized when exposed to the atmosphere in the process of depositing metal. Further, precursors of non-metal atomic bonds and electrical measurements are adversely affected by moisture. Therefore, atomic scale bonding and control are required in vacuum or a specific environment of, for example inert gas.

The invention provides an atomic scale synthesis platform for semiconductor material. The synthesis platform is precisely control to produce a novel material which is very useful for material science including development of new materials.

Figure 5:
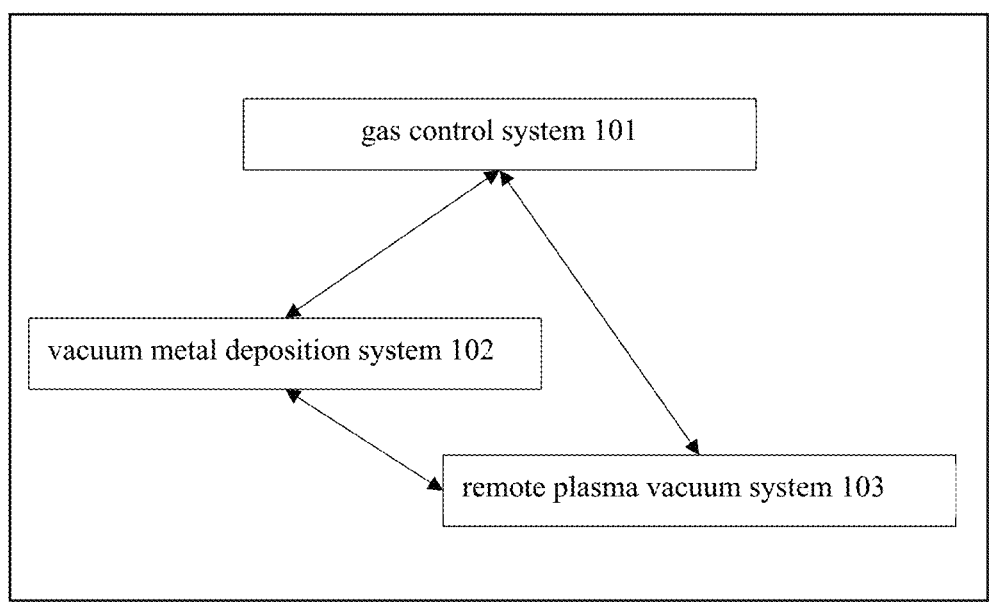
FIG. 5 is a block diagram of a synthesis platform for the artificial 2D material.

Referring to FIG. 5, it is a block diagram of a synthesis platform 100 for the artificial 2D material of the invention. The synthesis platform 100 includes a gas control system 101, an ultra-high vacuumed metal deposition system 102 and a remote plasma vacuum system 103 connected together. The artificial 2D material can be transferred among the three systems to achieve the purposes of removing atomic layers of the artificial 2D material and binding heterogeneous atoms. The ultra-high vacuumed metal deposition system 102 includes a metal deposition system such as thermal evaporation deposition system, electron beam evaporation system, or plasma sputtering system. The ultra-high vacuumed metal deposition system 102 can form a 2D metal atomic layer deposition. Further, the ultra-high vacuumed metal deposition system 102 has a stage for supporting the artificial 2D material, the stage is a cooling platform kept at a temperature less than −195.79° C. Preferably, the temperature is between room temperature and −269° C. The purpose of keeping the cooling platform is to prevent the energy of metal atoms evaporated by the thermal evaporation deposition system from transferring to surfaces of a 2D material. Otherwise, atomic defects may be generated on the 2D material. In short, the cooling platform aims to decrease probability of such damage. Moreover, temperature of the cooling platform can be increased to, for example a maximum of 250° C. and a rotational speed of 2 to 40 rpm. The ultra-high vacuumed metal deposition system 102 can deposit all required metallic films which can be of alloy or a single metal selected from the group consisting of titanium (Ti), vanadium (V), chromium (Cr), manganese (Mn), iron (Fe), cobalt (Co), nickel (Ni), copper (Cu), tin (Sn), zinc (Zn), zirconium (Zr), niobium (Nb), molybdenum (Mo), cadmium (Cd), gold (Au), platinum (Pt), hafnium (Hf), tantalum (Ta), bismuth (Bi), tungsten (W), rhenium (Re) and antimony (Sb). The ultra-high vacuumed metal deposition system 102 operates at an atmospheric pressure of $10^{-2}$-$10^{-10}$ Torr (i.e., high-quality vacuum). Therefore, metal oxidation is avoided and the metal deposition rate is between 0.01 Å/second and 1 Å/second.

The remote plasma vacuum system 103 is capable of introducing a number of plasmas including hydrogen (H), oxygen (O) and nitrogen (N)-based radicals for reaction. The remote plasma vacuum system 130 includes a remote chamber and a reaction chamber (both no shown). Precursor is ionized in the remote chamber prior to entering the reaction chamber having required samples (e.g., $MoS_2$ or other 2D materials) stored therein. The reaction chamber is spaced apart from the remote chamber and has a shield for the protection of the artificial 2D material impinged by plasmas. The remote plasma vacuum system 103 is capable of performing annealing at various temperature. In detail, after plasma has been used, an annealing is performed by the remote plasma vacuum system 103 (or the remote plasma vacuum system 103 increases temperature to 100-1000° C.) to repair defected lattices.

The gas control system 101 includes a chamber kept at a constant pressure and filled with inert gas (e.g., $N_2$, Ar, etc.). Within the chamber, there are also provided with a plurality of devices for manufacturing processes. The devices include heater, ovens, containers for chemical solution, etc. The precursor can be processed in the chamber. In detail, after an upper atomic layer of a 2D material has been removed, the gas control system 101 executes chemical processes including immerging, spraying and scrubbing to improve chemical properties of the 2D material. As such, the precursor can be adhered to the 2D material. The heaters or ovens are used to remove unnecessary solvent or atoms. As a result, metal atoms are bound or atoms of a compound of C, N, O and F are bound.

Figure 6:
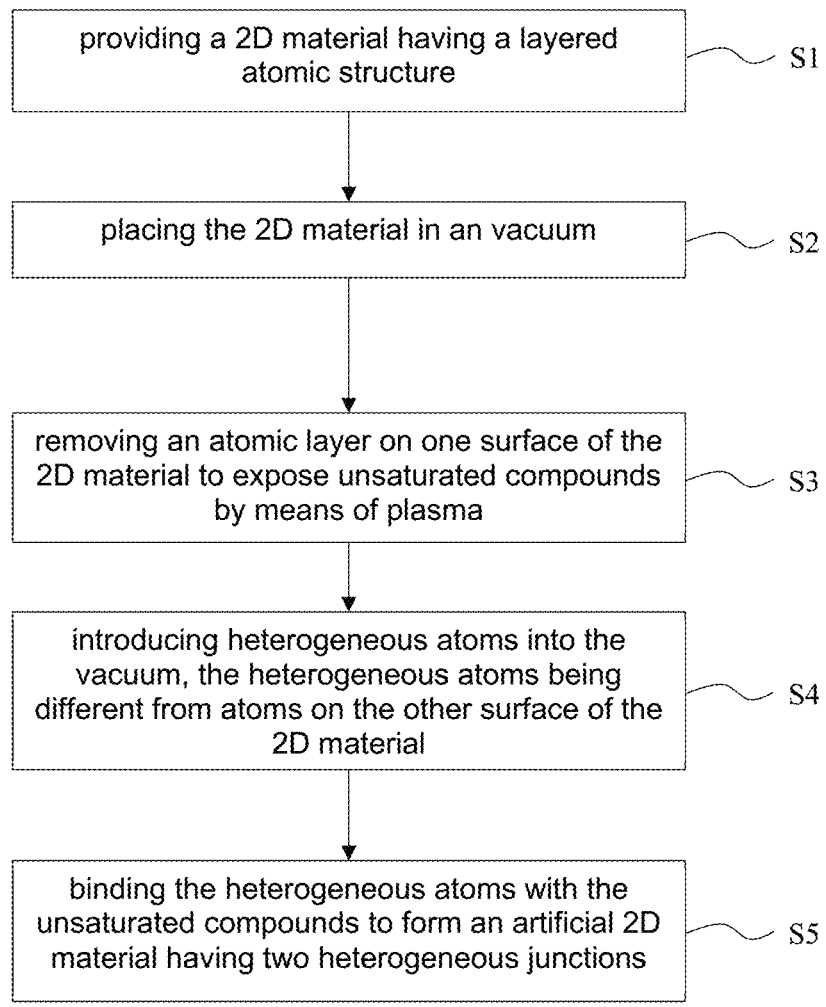
FIG. 6 is a flow chart of a method of manufacturing an artificial 2D material according to the invention using the synthesis platform, the artificial 2D material being that described in the first, second, third and fourth preferred embodiments.

Referring to FIG. 6 it is a flow chart of a method of manufacturing an artificial 2D material according to the invention using the synthesis platform 100, the artificial 2D material being that described in the first, second, third and fourth preferred embodiments. The method comprises the steps of S1 providing a 2D material having a layered atomic structure wherein the 2D material is selected from the group consisting of boron nitride (h-BN), silicone, germanene, stanene, phosphorene, and one of transition metal dichalcogenides (TMDs) including molybdenum disulfide ($MoS_2$), tungsten disulfide ($WS_2$), tungsten diselenide ($WSe_2$), and indium(II) selenide (InSe); S2 placing the 2D material in a vacuum; S3 removing an atomic layer on one surface of the 2D material to expose unsaturated compounds by means of plasma (e.g., argon plasma or hydrogen plasma); S4 introducing heterogeneous atoms into the vacuum wherein the heterogeneous atoms are different from atoms on the other surface of the 2D material; and S5 binding the heterogeneous atoms with the unsaturated compounds to form an artificial 2D material having two heterogeneous junctions.

Referring to FIGS. 5 and 6 again, a description of combining the synthesis platform 100 with the method of manufacturing an artificial 2D material according to the invention is as below. In the embodiment, a 2D transition metal dichalcogenide is used to manufacture a 2D alloy. It is understood that it is possible to manufacture an artificial 2D material having two heterogeneous junctions by means of a 2D material having a different layered atomic structure in other embodiments. In the embodiment, the method comprises the steps of providing a 2D-layered transition metal dichalcogenide(2D TMD) having a layered atomic structure; placing the 2D TMD in a vacuumed environment generated by the remote plasma vacuum system 103; removing an S or Se atomic layer on one surface of the 2D TMD to expose unsaturated compounds by means of hydrogen plasma wherein power is 20-200 W, hydrogen or a mixture thereof flows at a rate of 5-30 sccm, and a pressure is 5-800 mTorr; conveying the 2D TMD to the ultra-high vacuumed metal deposition system 102; introducing heterogeneous atoms into the vacuumed environment wherein the heterogeneous atoms are different from atoms on the other surface of the transition metal; and binding the heterogeneous atoms with the unsaturated compounds to form an artificial 2D material having two heterogeneous junctions. It is understood that above method is exemplary example and is not to limit the scope of the invention. The 2D material is configured to transfer among the three systems to achieve the purposes of atomic layer removal and binding the heterogeneous atoms with the unsaturated compounds. It is also understood that parameters are different in different materials and different manufacturing processes.

The step of removing atomic layers of the method of manufacturing an artificial 2D material of the invention can be implemented by means of argon plasma or hydrogen plasma.

Figure 7:
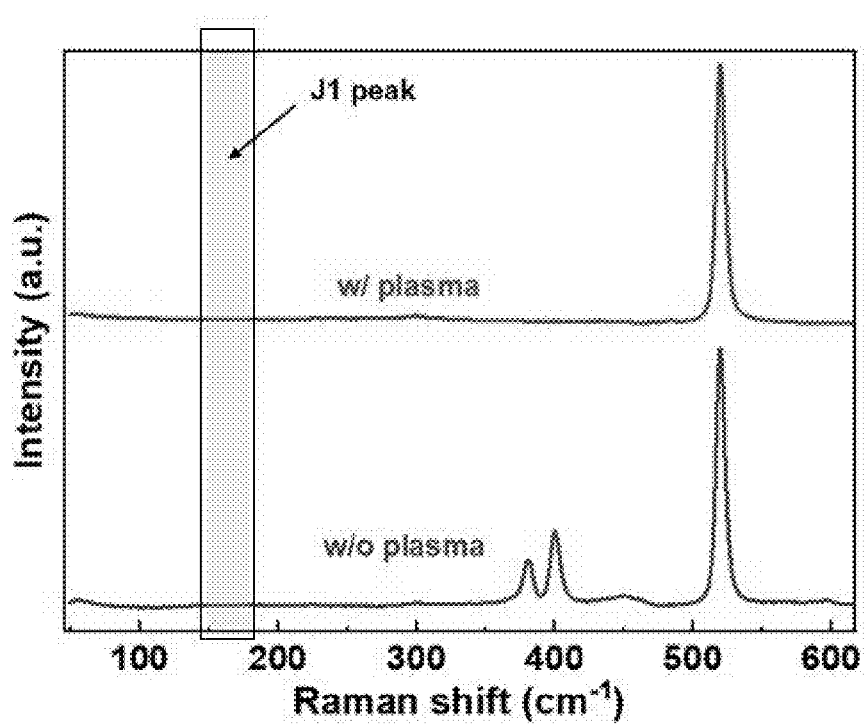
FIG. 7 plots Raman shift versus intensity for the artificial 2D material using hydrogen plasma and not using hydrogen plasma according to the invention.

Referring to FIG. 7, it plots Raman shift versus intensity for the artificial 2D material using hydrogen plasma and not using hydrogen plasma according to the invention in which a Raman spectrometer is used to prove junctions of the monolayer have been changed to the desired heterogeneous junctions due to chemical bonding. As shown, there are $MoS_2$ peaks in the range of 350 to 450 Raman shifts when hydrogen plasma is not used. The peaks are decreased or disappeared in other Raman shifts due to chemical properties changes at the junctions. This proves that the homogeneous junctions of $MoS_2$ no more exist after hydrogen plasma has been used. Instead, Mo—Ti junction of $MoS_2$ is formed. As a result, Raman vibration mode is changed. Further, it proves that improvements of junction of source and drain of FET can be obtained other than by etching or removing impurities.

As shown in FIG. 7 specifically, hydrogen plasma is used to remove an atomic layer on one surface of the 2D material. After the removal, it is found that in the Raman spectrometer there is no J1 peak which is used to determine whether there is a phase change in $MoS_2$. If yes, it means the phase has changed to 1T phase. $MoS_2$ has 2H and 1T phases in which 2H phase is semiconductor based and 1T is metallic. The peak is used to determine whether phase of $MoS_2$ has changed to 1T phase. Further, it proves that after the processing, the conventional argon plasma leads to change of 2H to 1T. In brief, using hydrogen plasma to in the manufacturing of the artificial 2D material of the invention can produce an artificial 2D material having semiconductor properties different from that produced by the conventional manufacturing process.

Moreover, it is found that contact resistance of source/drain of FET is greatly decreased in a metal contact by using argon plasma to change phase to 1T phase. This is because 1T phase is metallic. It should be understood that this structure is S atoms-Mo atoms-S atoms and is not related to the invention which involves removing a layer of S atoms from a monolayer using hydrogen plasma. Further, the bond of Mo atoms and S atoms is broken. It is possible to selectively remove S atoms from the upper atomic layer to obtain an atomic structure of —Mo—S. Also, the junction of Mo and S atoms of the lower layer is not damaged. The non-destruction technique of the invention is critical and contributes the metal contact of the interface. It can decrease contact resistance and improve semiconductor's performance by not causing destruction or phase change.

In the third embodiment of the invention, a method of manufacturing an artificial 2D material comprises she steps of providing transition metal $MoS_2$; removing an atomic layer of S atoms on one surface of the 2D material to expose unsaturated compounds of —Mo—S by means of hydrogen plasma; placing the 2D material having the unsaturated compounds of —Mo—S in the gas control system 101; immersing a precursor (e.g., $PtCl_2$) in the gas control system 101 so that the unsaturated compounds of —Mo—S may bind Pt atoms; drying contents in the gas control system 101; conveying the dried content in the gas control system 101 to the remote plasma vacuum system 103; annealing the content in the remote plasma vacuum system 103 at a temperature of 50-600° C. using H2 (or Ar); removing remaining Cl so that defects can be eliminated to manufacture a crystalline 2D material (Pt—Mo—S). In the third embodiment, the produced 2D material is further conveyed to the ultra-high vacuumed metal deposition system 102 to evaporating other metal atoms such as Co/Pt—Mo—S and Cu/Pt—Mo—S atoms. It is understood that above principles can be applied to cause Cu/W—Mo—S and W/Cu—Mo—S atoms to deposit a metal layer in contact. The 2D material is capable of transferring among three systems to achieve above purposes of removing atomic layers of the artificial 2D material and binding heterogeneous atoms so as to apply to both different materials and different manufacturing processes which require different parameters. It is understood that above description is exemplary and the invention is not limited by it. Any 2D material including alloy material can be used to manufacture an artificial 2D material having heterogeneous junctions and they are within the scope of the invention.

In the third embodiment of the invention, a 2D layered material is provided to manufacture MoOx, $HfO_2$ or $Ti_{0.87}O_2$ which is adapted to apply to gate insulating layer. Likewise, after an atomic layer of S atoms has been removed using hydrogen plasma, oxygen plasma (e.g., monolayer ALO) can be used to oxidize the 2D layered material to form an O—Mo—S structure which may facilitate ALD to form a gate insulating layer. Alternatively, after the atomic layer of S atoms has been removed, the 2D layered material can be transferred to a next station for evaporating Ti. Next, the 2D material is transferred to a next station to subject to oxygen plasma and annealing. As a result, TiOx is deposited on the surface of —Mo—S to form an insulator TiOx-Mo—S. In another aspect, it is possible to synthesize a $HfS_2$ structure on the surface of the 2D material, i.e., passing a precursor (Hf:TDMAH+S) through the remote plasma vacuum system 103, use $O_2$ to remove S atoms, and finally produce $HfO_2$/$MoS_2$.

In above method of manufacturing the artificial 2D material, the gas control system 101, the ultra-high vacuumed metal deposition system 102 and the remote plasma vacuum system 103 are interconnected. Each step such as removing an atomic layer or binding atoms can return to the gas control system 101 for check. A scanning probe microscope (SPM) is used to investigate the mechanical properties of the surface of the 2D material. Alternatively, Raman spectrometer or PL spectrometer is used to analyze differences between before and after the execution of atomic layer removal and bound chemical bonds. Further, a real time measurement of positive or negative of the film is performed in order to determine whether a metal layer or an oxidation layer is formed or not. Furthermore, an optical emission spectroscopy is used to monitor whether a reaction of atomic layer epitaxy/atomic layer deposition (ALE/ALD) is finished or not. Times of beginning and ending of the reaction can be obtained by observing S time curve of ALE S spectrum. This can precisely control the reaction and does not damage the 2D material. Finally, an annular dark-field scanning transmission electron microscopy (ADF-STEM) is used to analyze lattices and compositions at the junctions.

Regarding applications in electronic components, the 2D material is, for example for the manufacture of semiconductor devices. Thus, the 2D material is required to have acceptable energy gaps, high carrier mobility, high on-current current ratio, low energy consumption, high integration, and high reliability. Thus, there are many problems to be solved prior to mass production. These problems include controllability of large area synthesis, wafer level transfer, contact resistance, and reliability analysis of components. Particularly, the 2D materials are required to be compatible with current semiconductor manufacturing processes including extreme ultraviolet (EUV) radiation used in photolithography, patterns, metallic processes, and deposition and annealing of high-K materials. Factors including EUV photons used in photolithography capable of penetrating photoresist to damage the 2D material, and impact and reliability of electronic components made of conventional 2D material should be taken into consideration in the development of new 2D materials.

The invention provides an artificial 2D material having two heterogeneous junctions for electronic components. Further, the invention provides a method of manufacturing the artificial 2D material having two heterogeneous junctions in room temperature using remote plasma. The method is compatible with current semiconductor manufacturing processes. Thus, the method of the invention may use both photoresist and EUV radiation used in photolithography to form an artificial 2D material and both atomic layer removal and binding atoms can be performed on the artificial 2D material to obtain desired purposes.

Figure 8:
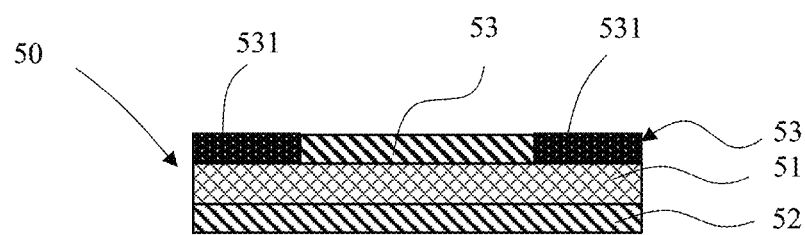
FIG. 8 is a longitudinal sectional view of the artificial 2D material of the invention showing a monolayer having a plurality of heterogeneous junctions.

Referring to FIG. 8, it is a longitudinal sectional view of an artificial 2D material 5 according to a fifth preferred embodiment of the invention. The artificial 2D material 5 is manufactured according to the method illustrated in FIG. 6 and is implemented as a monolayer having a plurality of heterogeneous zones as detailed below. The artificial 2D material 5 includes a middle atomic layer 51, a lower atomic layer 52 and an upper atomic layer 53. In the embodiment, the upper atomic layer 53 is a heterogeneous atomic layer.

Figure 9:
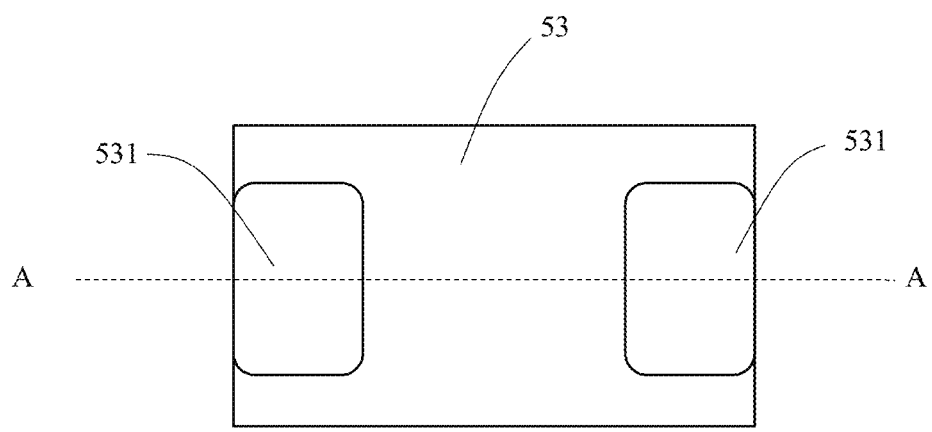
FIG. 9 is a top plan view of FIG. 8.

Referring to FIG. 9 in conjunction with FIG. 8 in which FIG. 9 is a top plan view of the artificial 2D material 5. The upper atomic layer 53 includes two spaced heterogeneous zones 531 each implemented as a metal atomic layer or a layer formed of oxide and other chemical compounds (e.g., nitride). A method of manufacturing the artificial 2D material 5 having a plurality of heterogeneous junctions comprises the steps of providing a 2D material having a layered structure. In the embodiment, the 2D material having the layered structure is a 2D TMD (e.g., $MoS_2$). $MoS_2$ includes a middle atomic layer 51, a lower atomic layer 52 and an upper atomic layer 53 in which the middle atomic layer 51 is made of, but not limited to Mo; the upper atomic layer 53 is made of, but not limited to sulfur (S); and the lower atomic layer 52 and the upper atomic layer 33 are disposed on lower and upper surfaces of the middle atomic layer 51 respectively. The method of the invention removes portions of the upper atomic layer 33 using hydrogen plasma, and binding heterogeneous atoms by chemical bonding to form a monolayer having a plurality of heterogeneous zones. The monolayer includes the upper atomic layer 53 and the heterogeneous zones 531.

As shown in FIG. 9 specifically, it is a top plan view of the artificial 2D material 5 and as shown in FIG. 8 specifically, it is a sectional view taken along line A-A of FIG. 9. It is understood that an artificial 2D material having heterogeneous zones is not limited to that shown in FIG. 8; and further, an artificial 2D material is not limited to have two heterogeneous zones 531 as shown in FIG. 8 or FIG. 9. An artificial 2D material having heterogeneous zones can be made depending on different manufacturing steps and different electronic components. The embodiment is only exemplary. An ordinary person skilled in the art can manufacture an artificial 2D material including a monolayer having a plurality of heterogeneous junctions using the method of the invention. The produced artificial 2D material can be used to manufacture rectifiers, integrated circuits and semiconductor devices including FETs.

Figure 10:
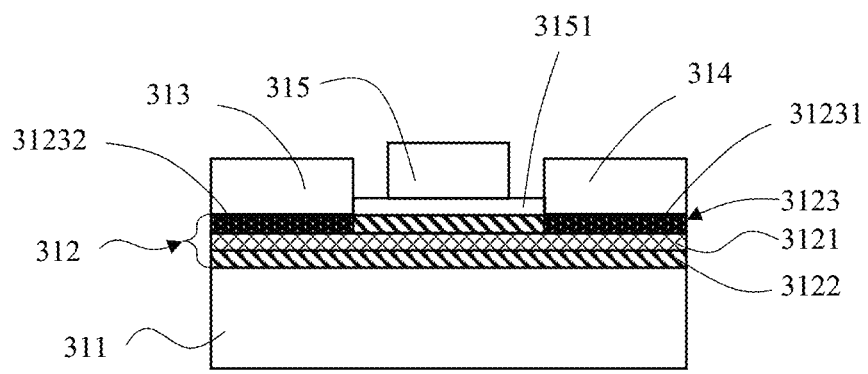
FIG. 10 is a schematic longitudinal sectional view of an electronic component (e.g., field-effect transistor (FET)) according to a first configuration of the invention, the electronic component incorporating the artificial 2D material of the invention.

Referring to FIG. 10, it is a schematic longitudinal sectional view of an electronic component (e.g., FET) 310 according to a first configuration of the invention, the electronic component 310 incorporating the artificial 2D material ($MoS_2$) of the invention. It is noted that the artificial 2D material can be a different chemical compound in other embodiments. In the embodiment, the electronic component 310 includes a substrate 311, an artificial 2D material layer 312, a source 312, a drain 314 and a gate 315. The artificial 2D material layer 312 includes a middle atomic layer 3121, a lower atomic layer 3122 below the middle atomic layer 3121, and an upper atomic layer 3123 on the middle atomic layer 3121. The upper atomic layer 3123 is heterogeneous and includes a first heterogeneous zone 31231 and a second heterogeneous zone 31232 spaced from the first heterogeneous zone 31231. In the embodiment, the first and second heterogeneous zones 31231, 31232 each implemented as a metal atomic layer. The source 313 is provided on the second heterogeneous zone 31232 and the drain 314 is provided on the first heterogeneous zone 31231 respectively. Each of the source 313 and the drain 314 are metallic electrodes. Thus, the source 313 is electrically connected to the metal atomic layer of the second heterogeneous zone 31232 by means of metallic bonding and the drain 314 is electrically connected to the metal atomic layer of the first heterogeneous zone 31231 by means of metallic bonding respectively.

A method of manufacturing the electronic component 310 of FIG. 10 comprises the steps of depositing an insulating layer on the substrate 311 using chemical vapor deposition (CVD) or atomic layer deposition (ALD) wherein the insulating layer includes $SiO_2$, $Si_2N_3$, $Al_2O_3$, $Hf_2O_3$ and BN or CaF; form an artificial 2D material layer 312 as a semiconductor channel material, using first photolithography to create minutely patterned thin films of suitable materials over the artificial 2D material layer 312; using etching (e.g., plasma etching) to chemically remove layers from the surface of artificial 2D material layer 312; using second photolithography to create minutely patterned thin films (e.g., the source 313 and the drain 314) of suitable materials over the artificial 2D material layer 312; using photoresist to form a patterned coating on the surface of the artificial 2D material layer 312 wherein the second heterogeneous zone 31232 under the source 313 and the first heterogeneous zone 31231 under the drain 314 are exposed respectively; using hydrogen plasma to remove atomic layers so as to form an Mo—S structure; metalizing wherein electronic beam evaporation is performed on the above metals so as to deposit a metal atomic layer on each of the first heterogeneous zone 31231 and the second heterogeneous zone 31232, thereby forming an M—Mo—S 2D alloy material layer thereon; forming the source 313 and the drain 314 on the n M—Mo—S 2D alloy material layer; forming a gate insulating layer 3151 including $SiO_2$, $Al_2O_3$, $Hf_2O_3$, and BN or CaF on the artificial 2D material layer 312; and finally using photolithography and deposition to form the gate 315 on the gate insulating layer 3151, thereby producing the electronic component 310.

Moreover, the same method steps can be arranged different in other embodiments as described in detailed below.

Figure 11:
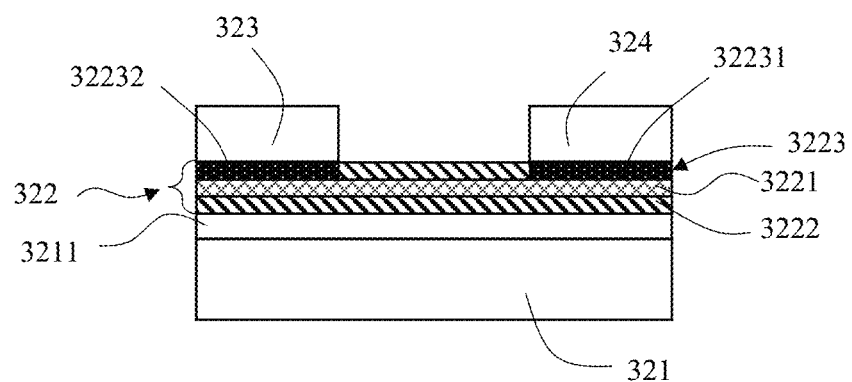
FIG. 11 is a schematic longitudinal sectional view of an electronic component (e.g., back-gated FET) according to a second configuration of the invention, the electronic component incorporating the artificial 2D material of the invention.

Referring to FIG. 11, it is a schematic longitudinal sectional view of an electronic component 320 according to a second configuration of the invention, the electronic component 320 incorporating the artificial 2D material of the invention. The electronic component 320 is implemented as a back-gated FET in which a highly doped substrate 321 (e.g., $P^{++}$ or $N^{++}Si$) is used as a fin. The method of manufacturing the electronic component 320 comprises the steps of depositing a gate insulating layer 3211 (e.g., $Al_2O_3$, $SiO_2$, nitride, or fluoride (e.g., CaF)); forming the artificial 2D material layer 322 including a middle atomic layer 3121, a lower atomic layer 3222 below the middle atomic layer 3221, and an upper atomic layer 3223 on the middle atomic layer 3221. The upper atomic layer 3223 is heterogeneous and includes a first heterogeneous zone 32231 and a second heterogeneous zone 32232 spaced from the first heterogeneous zone 32231. In the embodiment, the first and second heterogeneous zones 32231, 32232 each implemented as a metal atomic layer. The source 323 is provided on the second heterogeneous zone 32232 and the drain 324 is provided on the first heterogeneous zone 32231 respectively. Each of the source 323 and the drain 324 are metallic electrodes. Thus, the source 323 is electrically connected to the metal atomic layer of the second heterogeneous zone 32232 by means of metallic bonding and the drain 324 is electrically connected to the metal atomic layer of the first heterogeneous zone 32231 by means of metallic bonding respectively. The method of manufacturing the electronic component 320 further comprises the steps of using photolithography and deposition to form the channel on the gate insulating layer 3211; finally using hydrogen plasma to remove the upper metal atomic layers, materials using ALE and then conjugation with metal both based on the source 323 and the drain 324, thereby producing the electronic component 320.

Above electronic components further comprise FinFET, gate-all-around FET (GAAFET), stacked nanosheet FET, and multi-bridge channel FET (MBCFET). Above characteristics are related to selectively remove atomic layers from the source and the drain to decrease their contact resistance. Regarding heterogeneous junctions, above manufacturing process can be used to synthesize a gate insulating layer as a structure of next generational as GAAFET. GAAFETs can inhibit leakage current and have better channel control. But the thin channel of GAAFET limits current density. Also, a vertical multi-channel limits height and causes interference with internal connection layers. Further, parasite capacitance adversely affects switching rate. The main bottleneck is that the manufacturing steps of the nanoscale GAAFET are more complicated and in turn it greatly increases the manufacturing cost and lowers yield. Thus, a stacked nanosheet FET is considered to be the optimum scheme for solve above problems. However, regarding the manufacturing of the stacked nanosheet FET, a Si/SiGe super lattice is used to selectively remove SiGe from the stacked nanosheet FET to obtain a suspended nanoscale element of Si. Next, ALD is performed to deposit a dielectric layer and a gate metal layer. But there is challenge to conformal coating of ALD and is different from the steps of the conventional CMOS process. Further, both nanosheet and GAAFET require an atomic layer deposition to fill gaps in the suspended lower layer. However, it greatly increases difficulties of manufacturing the semiconductor devices. Further, there is no disclosure about using 2D semiconductor to verify the structure of the semiconductor devices.

Figure 12:
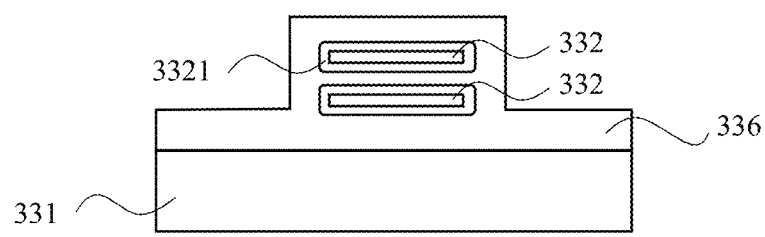
FIG. 12 is a schematic longitudinal sectional view of an electronic component according to a third configuration of the invention, the electronic component incorporating the artificial 2D material of the invention.

Referring to FIG. 12, it is a schematic longitudinal sectional view of an electronic component 330 according to a third configuration of the invention, the electronic component 330 incorporating the artificial 2D material of the invention. The electronic component 330 includes a substrate 331, a gate 336 provided on the substrate 331, a plurality of (two are shown) spaced, staked artificial 2D material layers 332 in the gate 336, and a plurality of (two are shown) gate insulating layers (e.g., oxide layers or layers made of an insulator material such as nitride or fluoride) 3321 in the gate 336 and each wrapped around the artificial 2D material layer 332. In the third configuration, a TMD is staked in $MoS_2$/oxide/$MoS_2$/oxide. Next, reactive-ion etching (ME) is used to define source/drain and contact and remove deposited materials to form the defined pattern with $MoS_2$ nanosheets exposed. It is noted that in above method the insulating layer in 2D nanosheet is required to remove. Finally, use ALD to fill drive-in metal precursor in the metal gate 336 which wraps around the 2D channels. It is understood that various heterostructures including 2D semiconductor and metal junctions, insulator oxides, and 2D semiconductor devices (e.g., PRAM, rectifiers, etc.) by taking advantage of above two principles.

In the artificial 2D oxide having heterogeneous junctions, an optimum k value of 2D-$TiO_2$ is about equal to 125 and it is appropriate for semiconductor gate dielectric layer. In other embodiments, the gate insulating layer is a 2D layered oxide such as $MoO_x$, $HfO_2$ or $Ti_{0.87}O_2$. By utilizing the same principle, the method comprises the following steps: After an atomic layer of S atoms has been removed using hydrogen plasma in the remote plasma vacuum system, oxygen plasma (e.g., monolayer ALO) can be used to oxidize the 2D layered material to form an O—Mo—S structure which may facilitate ALD to form a gate insulating layer. Alternatively, after the atomic layer of S atoms has been removed, the 2D layered material can be transferred to a next station for evaporating Ti. Next, the 2D material is transferred to the remote plasma vacuum system to subject to oxygen plasma and annealing. As a result, TiOx is deposited on the surface of —Mo—S to form an insulator TiOx-Mo—S. In another aspect, it is possible to synthesize a $HfS_2$ structure on the surface of the 2D material, i.e., passing a precursor (Hf:TDMAH+S) through the remote plasma vacuum system, use $O_2$ to remove S atoms, and finally produce $HfO_2$/$MoS_2$. Moreover, the remote plasma vacuum system may use hydrogen plasma to remove S atoms from the surfaces of synthesized nitride (or other 2D chemical compound) and in turn transfer the synthesized nitride (or other 2D chemical compound) to the gas control system to be processed by inert gas under a constant pressure. Also, the solution precursor is used to bind the synthesized nitride (or other 2D chemical compound) with chemical bonding. This process is a wet process and can adhere precursors including N, C and p atoms to the synthesized nitride (or other 2D chemical compound) by immersing. The manufacturing of the 2D insulating layer can be applied to the manufacturing of insulating layers of the above electronic components such as the gate insulating layer 3151 of FIG. 10, the gate insulating layer 3221 of FIG. 11 and the gate insulating layer 3321 of FIG. 12.

It is noted that the synthesis can be achieved using the interconnected systems of FIG. 5. Load lock chambers and vacuum valves are used by the systems for transferring materials among them in a closed environment. The remote plasma vacuum system includes a chamber having a low damage to remote plasma which is one of H, Ar, O and N plasmas by switching. The systems thus carry out processes such as ALE and atomic layer oxidation (ALO). The gas control system is implemented as chamber containing inert gas under a constant pressure so that a number of precursor processes including wet type adhering and binding with chemical bonding. The electronic beam evaporation system is implemented as a high-quality vacuumed chamber and is capable of precisely depositing different metal atoms.

Figure 13:
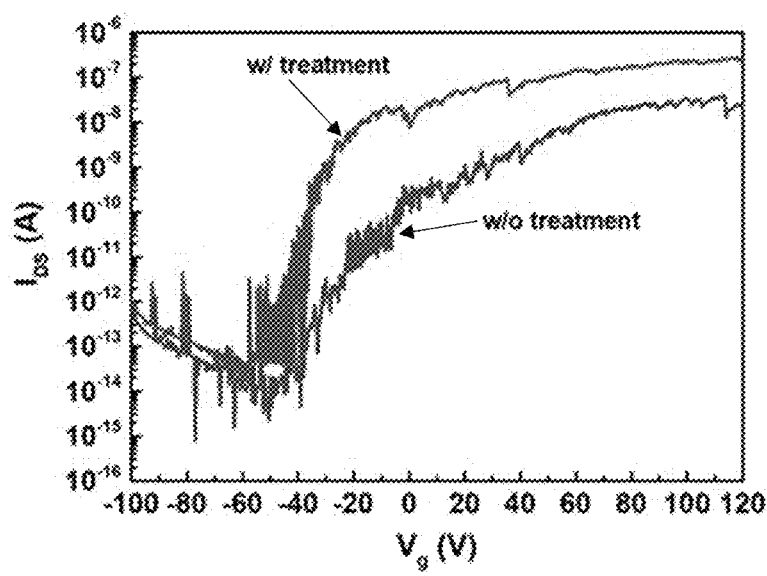
FIG. 13 plots $V_G(V)$ versus $I_{DS}(A)$ for an electronic component formed of artificial 2D material of the first preferred embodiment of the invention with or without treatment as comparison.

Referring to FIG. 13, it plots $V_G(V)$ versus $I_{DS}(A)$ for an electronic component formed of artificial 2D material of the first preferred embodiment of the invention with or without treatment as comparison. Source and drain contact is processed at the same channel material. It is found that the electronic component's performance in electronic properties is greatly increased. Carrier mobility of the electronic component is 3.5 times greater than that of a sample which is not processed at its interface. Both on-current and on-off ratio of the electronic component are increased about 7 times. It is concluded that a metallized 2D material has improved carrier injection conjunctions and greatly increased performance.

Figure 14:
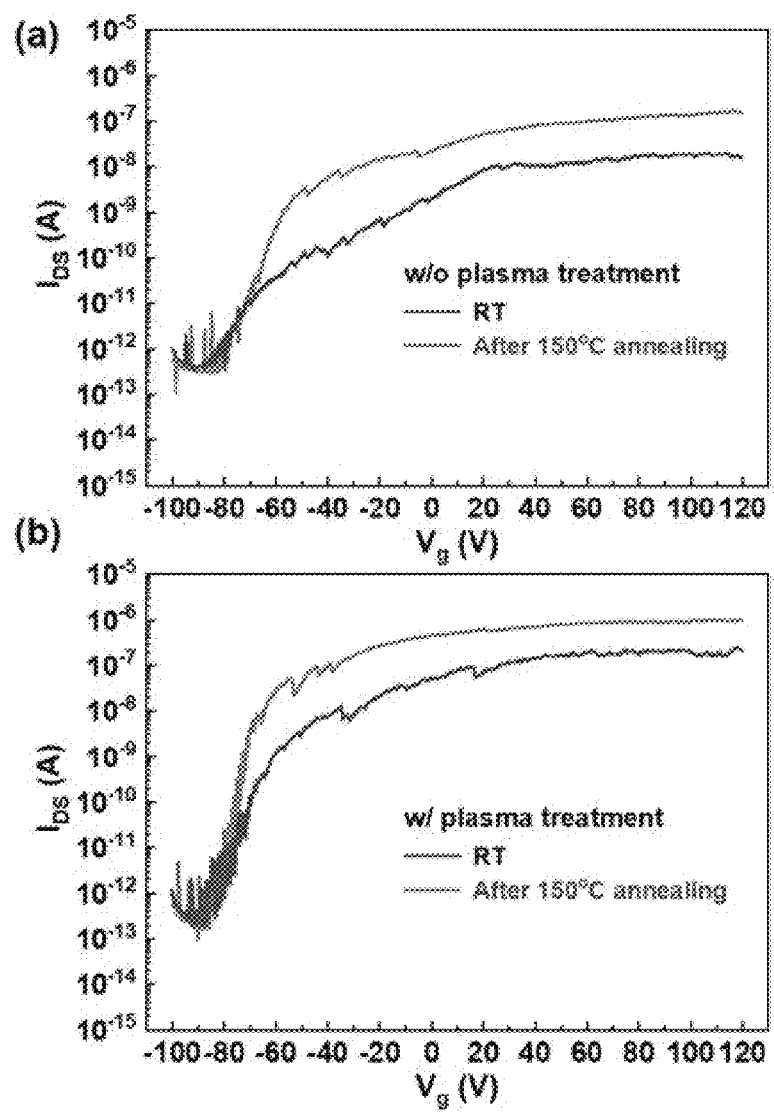
FIG. 14 in part (a) plots $V_G(V)$ versus $I_{DS}(A)$ for an electronic component formed of artificial 2D material of the first preferred embodiment of the invention without plasma treatment; and in part (b) plots $V_G(V)$ versus $I_{DS}(A)$ for an electronic component formed of artificial 2D material of the first preferred embodiment of the invention with plasma treatment.

Referring to FIG. 14, in part (a) it plots $V_G(V)$ versus $I_{DS}(A)$ for an electronic component formed of artificial 2D material of the first preferred embodiment of the invention without plasma treatment; and in part (b) it plots $V_G(V)$ versus $I_{DS}(A)$ for an electronic component formed of artificial 2D material of the first preferred embodiment of the invention with plasma treatment. The electronic component is implemented as Ti—Mo—S semiconductor device. As shown in part (a), the Ti—Mo—S semiconductor device has not been treated by plasma and has been processed by 150° C. annealing, and has decreased contact resistance. But it is not reliable. Further, other electrical properties including low on-off ratio, low carrier mobility and high subthreshold swing are not desired. As a comparison, as shown in part (b), the Ti—Mo—S semiconductor device has been treated by plasma and has been processed by 150° C. annealing, and has decreased contact resistance. Also it is reliable. Further, other electrical properties including high on-off ratio, high carrier mobility and low subthreshold swing are desired. It is noted that the annealing temperature is between 50-900° C. and preferably, between 50-300° C.

The artificial 2D material having a plurality of heterogeneous junctions of the invention has the following advantages and benefits in comparison with TMDs of the conventional art: Improved performance, higher controllability of electronic components, lower contact resistance, lower energy consumption, higher efficiency and higher integration.

While the invention has been described in terms of preferred embodiments, those skilled in the art will recognize that the invention can be practiced with modifications within the spirit and scope of the appended claims.

What is claimed is:

1. A two-dimensional electronic component, comprising:
   a substrate;
   an artificial two-dimensional (2D) material disposed on the substrate; and
   a first metallic electrode disposed on the artificial 2D material;
   wherein the artificial 2D material includes a layered atomic structure including a middle atomic layer, a lower atomic layer disposed on a lower surface of the middle atomic layer, and an upper atomic layer disposed on an upper surface of the middle atomic layer respectively; and
   wherein the upper atomic layer and the first metallic electrode are attracted together at a junction therebetween by metallic bonding.

2. The two-dimensional electronic component as claimed in claim 1, wherein the upper atomic layer includes a first heterogeneous zone which is a first metal atomic layer; and wherein the first metal atomic layer and the first metallic electrode are attracted together at a junction therebetween by metallic bonding.

3. The two-dimensional electronic component as claimed in claim 2, further comprising:
   a second heterogeneous zone which is a second metal atomic layer;
   a second metallic electrode disposed on the second metal atomic layer wherein the second metal atomic layer and the second metallic electrode are attracted together at a junction therebetween by metallic bonding;
   a gate insulating layer disposed on the upper atomic layer; and
   a gate disposed on the gate insulating layer to form an upper gate transistor;
   wherein the artificial 2D material is a semiconductor channel material.

4. The two-dimensional electronic component as claimed in claim 2, wherein the upper atomic layer further comprises a second heterogeneous zone formed of oxide and other chemical compounds.

5. The two-dimensional electronic component as claimed in claim 4, wherein the oxide and other chemical compounds is oxide.

6. The two-dimensional electronic component as claimed in claim 4, wherein the oxide and other chemical compounds is nitride.

7. The two-dimensional electronic component as claimed in claim 2, wherein the first metal atomic layer is formed of metal atoms which are atoms of nickel (Ni), tungsten (W), copper (Cu), titanium (Ti), palladium (Pd), bismuth (Bi), antimony (Sb) or platinum (Pt).

8. The two-dimensional electronic component as claimed in claim 7, wherein the middle atomic layer is a 2D planar atomic structure formed of a transition metal.

9. The two-dimensional electronic component as claimed in claim 8, wherein the transition metal selected from the group consisting of tungsten (W), molybdenum (Mo), titanium (Ti), platinum (Pt), indium (In), tin (Sn), niobium (Nb) and Tantalum (Ta).

10. The two-dimensional electronic component as claimed in claim 9, wherein the lower atomic layer is formed of sulfur(S), selenium (Se), or tellurium (Te).

11. A method of manufacturing a two-dimensional (2D) electronic component, wherein the 2D electronic component comprises a substrate, an artificial two-dimensional (2D) material disposed on the substrate, and a first metallic electrode disposed on the artificial 2D material, the artificial 2D material includes a layered atomic structure including a middle atomic layer, a lower atomic layer disposed on a lower surface of the middle atomic layer, and an upper atomic layer disposed on an upper surface of the middle atomic layer respectively, the upper atomic layer and the first metallic electrode are attracted together at a junction therebetween by metallic bonding, the method comprising the steps of:
   providing the substrate;
   placing the artificial 2D material having the layered atomic structure on the substrate in a vacuumed environment;
   defining a first heterostructure on the upper atomic layer of the artificial 2D material to make a semiconductor pattern;
   using plasma to remove the upper atomic layer of the artificial 2D material to expose unsaturated compounds; and
   introducing heterogeneous atoms into the vacuumed environment wherein the heterogeneous atoms are different from atoms of the upper atomic layer of the artificial 2D material; and
   binding the heterogeneous atoms with the unsaturated compounds to form a first heterogeneous zone.

12. The method as claimed in claim 11, wherein the heterogeneous atoms are atoms of an atomic structure formed of metal, and wherein the metal is selected from the group consisting of nickel (Ni), tungsten (W), copper (Cu), titanium (Ti), palladium (Pd), bismuth (Bi), antimony (Sb) or platinum (Pt).

13. The method as claimed in claim 11, further comprising the step of forming a metallic electrode on the first heterogeneous zone by performing a semiconductor process.

14. The method as claimed in claim 11, wherein the upper atomic layer includes the first heterogeneous zone which is a first metal atomic layer; and wherein the first metal atomic layer and the first metallic electrode are attracted together at a junction therebetween by metallic bonding.

15. The method as claimed in claim 14, wherein the upper atomic layer further comprises a second heterogeneous zone formed of oxide and other chemical compounds.

* * * * *